(12) United States Patent
Shiraishi

(10) Patent No.: US 7,838,907 B2
(45) Date of Patent: Nov. 23, 2010

(54) SEMICONDUCTOR DEVICE AND POWER CONVERSION DEVICE USING THE SAME

(75) Inventor: Masaki Shiraishi, Hitachinaka (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/141,978

(22) Filed: Jun. 19, 2008

(65) Prior Publication Data

US 2008/0315257 A1 Dec. 25, 2008

(30) Foreign Application Priority Data

Jun. 19, 2007 (JP) ............... 2007-160882

(51) Int. Cl.
*H01L 27/06* (2006.01)
*H01L 27/095* (2006.01)
*H01L 29/778* (2006.01)
*H01L 21/8232* (2006.01)
*H01L 21/338* (2006.01)

(52) U.S. Cl. ............... 257/195; 257/194; 257/284; 257/302; 257/476; 257/477; 257/E27.016; 257/E27.022; 438/172

(58) Field of Classification Search ............... 257/195, 257/E27.016, 192, 189, 267, 284, 302, 474, 257/476, 477, E27.022, E29.009, E27.069, 257/E27.038–E27.04, 194, E29.089, E29.246, 257/E27.014–E27.015, E27.02–E27.021; 438/167, 172, 191

See application file for complete search history.

(56) References Cited

U.S. PATENT DOCUMENTS

| | | | | |
|---|---|---|---|---|
| 6,495,888 | B1 * | 12/2002 | Yamato | 257/355 |
| 6,936,877 | B2 * | 8/2005 | Klee et al. | 257/296 |
| 6,953,981 | B1 * | 10/2005 | Johansson et al. | 257/503 |
| 7,291,872 | B2 * | 11/2007 | Hikita et al. | 257/192 |
| 2002/0177326 | A1 * | 11/2002 | Klee et al. | 438/758 |
| 2006/0060895 | A1 * | 3/2006 | Hikita et al. | 257/280 |
| 2007/0045765 | A1 * | 3/2007 | Brar et al. | 257/481 |
| 2007/0228401 | A1 * | 10/2007 | Machida et al. | 257/96 |
| 2008/0124889 | A1 * | 5/2008 | Roggenbauer et al. | 438/404 |

FOREIGN PATENT DOCUMENTS

| | | | |
|---|---|---|---|
| JP | 2006-086398 A | | 3/2006 |
| JP | 2006086398 A | * | 3/2006 |

* cited by examiner

*Primary Examiner*—Zandra Smith
*Assistant Examiner*—Jeremy J Joy
(74) *Attorney, Agent, or Firm*—Miles & Stockbridge P.C.

(57) ABSTRACT

In a semiconductor device in which a diode and a high electron mobility transistor are incorporated in the same semiconductor chip, a compound semiconductor layer of the high electron mobility transistor is formed on a main surface (first main surface) of a semiconductor substrate of the diode, and an anode electrode of the diode is electrically connected to an anode region via a conductive material embedded in a via hole (hole) reaching a $p^+$ region which is the anode region of the main surface of the semiconductor substrate from a main surface of the compound semiconductor layer.

16 Claims, 9 Drawing Sheets

SEMICONDUCTOR DEVICE AND POWER CONVERSION DEVICE USING THE SAME

CROSS-REFERENCE TO RELATED APPLICATION

The present application claims priority from Japanese Patent Application No. JP 2007-160882 filed on Jun. 19, 2007, the content of which is hereby incorporated by reference into this application.

TECHNICAL FIELD OF THE INVENTION

The present invention relates to a technology for a semiconductor device. More particularly, it relates to a technology effectively applied to a semiconductor device used for a power conversion device.

BACKGROUND OF THE INVENTION

A power conversion device is a device which converts input power to desired output power by controlling ON/OFF of an element called a switching element, and is utilized in various purposes such as power sources of various electronic devices and driving power supply for a motor or the like.

The switching element of the power conversion device is constituted of a semiconductor transistor and a diode connected in parallel to each other. For example, a power MOSFET (Metal Oxide Semiconductor-Field Effect Transistor), IGBT (Insulated Gate Bipolar Transistor) and others are used as this semiconductor transistor.

Single crystal Si (silicon) is generally used for semiconductor layers constituting the power MOSFET and IGBT. However, some MOSFETs use a wide band-gap semiconductor such as SiC (silicon carbide) having a band gap wider than that of Si for the semiconductor layers in recent years.

Also, as the transistor using a wide band-gap semiconductor, a transistor called a HEMT (High Electron Mobility Transistor) using a III-V compound semiconductor such as GaN (gallium nitride) has been known.

For example, Japanese Patent Application Laid-Open Publication No. 2006-86398 (Patent Document 1) discloses a transistor having a HEMT structure in which a buffer layer, a channel layer made of a III-V nitride semiconductor and a Schottky layer made of a III-V nitride semiconductor are formed on a conductive layer, and a source electrode, a drain electrode and a gate electrode are formed above the Schottky layer.

SUMMARY OF THE INVENTION

The inventor of the present invention has studied a semiconductor device particularly used for a power conversion device and found out the following problems.

The required breakdown voltage performance of the power conversion device differs depending on the purposes. For example, a power conversion device for supplying AC power for driving a motor of a hybrid automobile is required to have a breakdown voltage performance of about 600 V.

When an IGBT transistor is used for a switching element of a power conversion device in order to obtain breakdown voltage performance of about 600 V, since the IGBT cannot form a diode in the same chip, a semiconductor chip having an IGBT element and a semiconductor chip having a diode are mounted in parallel connection. Therefore, two semiconductor chips are required for one switching element, and thus, the cost of the power conversion device is increased. In other words, there is a problem that demands for miniaturization cannot be satisfied.

In addition, the IGBT has a large switching loss compared with the power MOSFET. Moreover, since the IGBT has high built-in potential of about 1 V, when the power conversion device is diverted to a purpose of supplying small power, the power loss is increased due to the high on-voltage.

Meanwhile, a MOSFET which uses single crystal Si for a semiconductor layer can form a MOSFET element and a diode in the same chip. However, when it is configured to have high breakdown voltage of 200 V, the power loss is increased due to the high on-resistance (in other words, the efficiency of the power conversion device is decreased).

When a transistor having a wide band-gap semiconductor such as SiC or GaN is used as the transistor, since the wide band-gap semiconductor has high dielectric breakdown strength compared with Si, the on-resistance can be reduced compared with the transistor having a Si semiconductor layer if it has the same breakdown voltage performance.

However, since the wide band-gap semiconductor of SiC has high built-in potential of pn junction of about 3 V, a diode of pn junction cannot be formed in the wide band-gap semiconductor region. Further, in the case of the MOSFET having a SiC semiconductor layer, although there is a method of forming a Schottky barrier diode in the SiC semiconductor layer, the cost of the power conversion device is increased due to the complicated manufacturing method and the increase in the chip area.

Therefore, also in the case where the transistor having the wide band-gap semiconductor is used, similarly to the case where the IGBT element is used, the transistor and the diode cannot be incorporated in the same chip, and as a result, there is a problem that demands for miniaturization of the power conversion device cannot be sufficiently satisfied.

A typical object of the present invention disclosed in this application is to provide a technology capable of miniaturizing a switching element of a power conversion device.

Also, another typical object of the present invention disclosed in this application is to provide a technology capable of improving the power conversion efficiency of the power conversion device.

The above and other objects and novel characteristics of the present invention will be apparent from the description of this specification and the accompanying drawings.

The typical ones of the inventions disclosed in this application will be briefly described as follows.

That is, the present invention provides a semiconductor device in which a diode and a high electron mobility transistor are incorporated in the same semiconductor chip, in which a compound semiconductor layer of the high electron mobility transistor is formed on a first main surface of a semiconductor substrate of the diode, and an anode electrode of the diode is electrically connected to an anode region via a conductive material embedded in a hole reaching the anode region of the first main surface of the semiconductor substrate from a main surface of the compound semiconductor layer.

The effects obtained by typical aspects of the present invention will be briefly described below.

That is, a switching element of a power conversion device can be miniaturized.

BRIEF DESCRIPTIONS OF THE DRAWINGS

DESCRIPTIONS OF THE PREFERRED EMBODIMENTS

Components having the same function are denoted by the same reference numbers throughout the drawings for describing the embodiment, and the repetitive description thereof will be omitted. Hereinafter, embodiments of the present invention will be described in detail with reference to the accompanying drawings.

First Embodiment

In a first embodiment, an embodiment in which a semiconductor device provided with a high electron mobility transistor is applied as a switching element of a power conversion device will be described.

<Circuit Configuration of Power Conversion Device>

Figure 1:
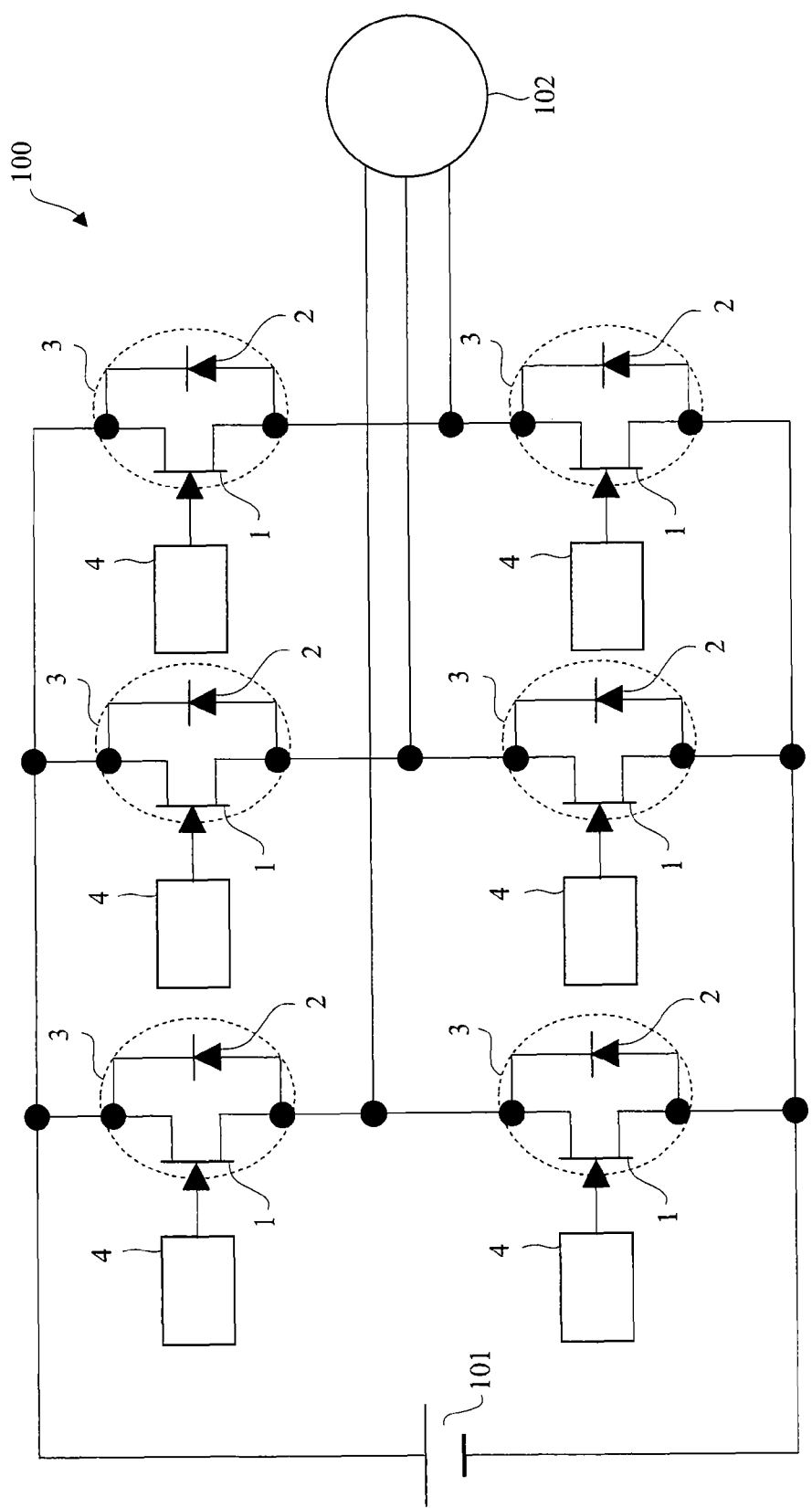
FIG. 1 is a circuit diagram showing a circuit structure of a power conversion device according to a first embodiment of the present invention.

First, a circuit configuration of the power conversion device of the first embodiment will be described with reference to FIG. 1. FIG. 1 is a circuit diagram of the power conversion device of the first embodiment.

In FIG. 1, the power conversion device 100 of the first embodiment is, for example, a DC (Direct Current)-AC (Alternating Current) inverter which converts the DC power supplied from a DC power source 101 to three-phase AC power and supplies it to a motor 102 which operates as a load.

Also, the power conversion method of the power conversion device 100 is a switching method, and a switching element 3 has a transistor 1 and a diode 2. The transistor 1 and the diode 2 are connected in parallel. FIG. 1 shows an example in which a total of six switching elements 3 corresponding to upper and lower arms and three phases are disposed.

Note that the number of the switching elements 3 used in the power conversion device 100 is not limited to six. It is possible to arbitrarily select the number of switching elements 3 in accordance with the type of power conversion (for example, DC-AC, AC-DC, or DC-DC) or the required power source voltage.

A gate driver 4 is electrically connected to each input of the switching element 3, and each of the switching elements 3 is driven by the gate driver 4.

Here, the transistor 1 provided in the switching element 3 shown in FIG. 1 is a high electron mobility transistor called HEMT (High Electron Mobility Transistor).

The HEMT has low on-resistance compared with the MOSFET and IGBT. Therefore, by using the HEMT as the switching element 3 of the power conversion device 100, the power loss caused at the power conversion can be reduced. Therefore, compared with a power conversion device using the MOSFET or IGBT as the switching element, the power conversion device 100 can improve the power conversion efficiency.

Also, GaN (gallium nitride) used for the channel layer of the HEMT has dielectric breakdown strength about ten times as high as that of Si. Therefore, the breakdown voltage performance of the switching element 3 can be improved. Accordingly, the power conversion device 100 can be applied to, for example, a power conversion device required to have a breakdown voltage of about 600 V to be used for supplying AC power for driving a motor of a hybrid automobile.

<Structure of Semiconductor Device>

Next, a structure of the semiconductor device of the first embodiment will be described with reference to FIG. 2.

Figure 2:
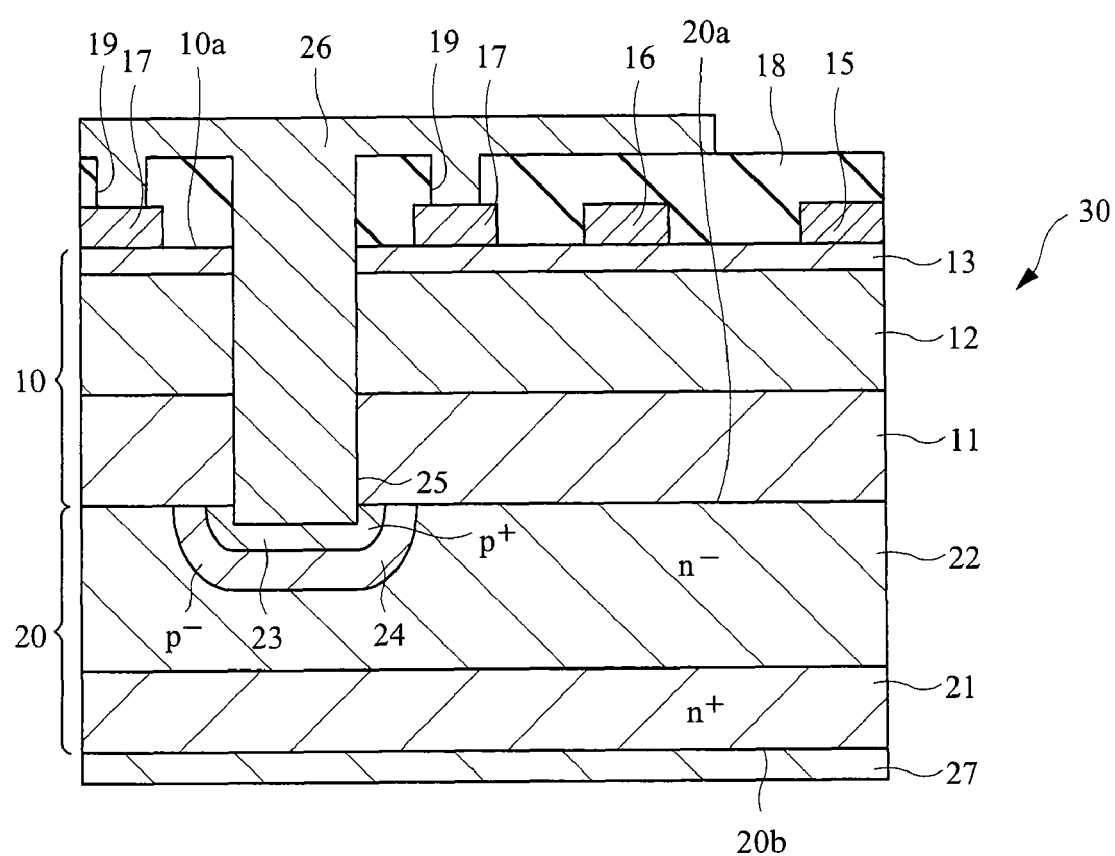
FIG. 2 is a cross sectional view showing a main part of a semiconductor chip constituting a semiconductor device according to the first embodiment of the present invention.

FIG. 2 is a cross sectional view showing a main part of a semiconductor chip constituting the semiconductor device of the first embodiment.

In FIG. 2, the semiconductor chip 30 of the first embodiment has a semiconductor substrate (first substrate) 20 and a compound semiconductor layer (second substrate) 10 formed on the semiconductor substrate 20. Also, a diode and a transistor are formed on the semiconductor substrate 20 and the compound semiconductor layer 10, respectively.

More specifically, the semiconductor chip 30 corresponds to the switching element 3 shown in FIG. 1, and the transistor 1 and the diode 2 provided in the switching element 3 are incorporated in the single semiconductor chip 30.

The transistor of the semiconductor chip 30 has a buffer layer (first compound semiconductor layer) 11 made of AlN (aluminum nitride), a channel layer (second compound semiconductor layer) 12 made of undoped GaN, and an electron supplying layer (third compound semiconductor layer) 13 made of AlGaN (aluminum gallium nitride) sequentially stacked in this order on a main surface (first main surface) 20a of the semiconductor substrate 20 in which the diode is formed.

Thus, this transistor is a HEMT element having a GaN layer which is an undoped III-V compound semiconductor as the channel layer 12.

In addition, the transistor has a drain electrode 15, a gate electrode 16 and a source electrode 17 sequentially disposed on a main surface (third main surface) 10a of the compound semiconductor layer 10 along the main surface 10a. The drain electrode 15, the gate electrode 16 and the source electrode 17 are not in contact with one another and disposed on the main surface 10a at predetermined intervals.

Further, the drain electrode 15, the gate electrode 16 and the source electrode 17 are electrically connected to a drain pad, a gate pad and a source pad (not shown) which serve as external connection terminals of the semiconductor chip 30, respectively.

The drain electrode 15 and the source electrode 17 are formed of, for example, a stacked body of Ti (titanium) and Al (aluminum) formed thereon. Also, the gate electrode 16 is formed of, for example, a stacked body of Ni (nickel) and Au (gold) formed thereon.

Further, on the main surface 10a of the compound semiconductor layer 10, an insulating layer 18 which is a stacked body of, for example, SiN (silicon nitride) and $SiO_2$ (silicon dioxide) is deposited. The insulating layer 18 is formed so as to cover the drain electrode 15, the gate electrode 16 and the source electrode 17 and fill the spaces between the electrodes.

On the other hand, the semiconductor substrate 20 in which the diode is formed has an $n^+$ layer (first semiconductor layer, cathode region) 21 of the n type (first conductivity type) having a main surface (second main surface) 20b and an $n^-$ layer (second semiconductor layer, cathode region) 22 formed on the $n^+$ layer 21. Each of the $n^+$ layer 21 and the $n^-$ layer 22 is a semiconductor layer obtained by adding a predetermined amount of an impurity (for example, phosphorus) to Si which is a semiconductor. In other words, the semiconductor substrate 20 is a Si substrate.

Moreover, in a part of the semiconductor substrate 20 on the main surface 20a side, a $p^+$ region (anode region) 23 and a $p^-$ region (anode region) 24 of the p type (second conductivity type) are formed. In other words, a pn junction diode is formed in the semiconductor substrate 20.

Here, the pn junction showing electrical characteristics as the diode is realized by the junction of the $n^-$ layer 22 and the $p^-$ region 24. The $n^+$ layer 21 and the $p^+$ region 23 function as contact layers for establishing ohmic connection with a cathode electrode 27 and an anode electrode 26, respectively. In the description of this specification, the portion including the $n^-$ layer 22 and the $n^+$ layer 21 is referred to as a cathode region, and the portion including the $p^-$ region 24 and the $p^+$ region 23 is referred to as an anode region.

The anode electrode 26 of the diode is formed on the main surface 10a of the compound semiconductor layer 10, specifically, on the insulating layer 18 deposited on the main surface 10a. Also, a via hole (hole) 25 reaching the anode region of the semiconductor substrate 20 from the main surface 10a is formed in the compound semiconductor layer 10. The via hole 25 penetrates also through the insulating layer 18. Further, the via hole 25 is formed to reach the $p^+$ region 23 which is the contact layer of the anode region of the semiconductor substrate 20.

Also, the via hole 25 is filled with a conductive material such as Al. The anode electrode 26 formed on the main surface 10a and the conductive material filled in the via hole 25 have an integral structure, and therefore, they are electrically connected to each other. In short, the anode electrode 26 is electrically connected to the anode region via the conductive material filled in the via hole 25.

By forming the via hole 25 so as to reach the anode region of the semiconductor substrate 20 from the main surface 10a, the electrical connection of the anode region formed in the semiconductor substrate 20 and the anode electrode 26 can be ensured on the main surface 10a of the transistor.

Also, the cathode electrode 27 of the diode is formed on the main surface 20b side of the semiconductor substrate 20. The cathode electrode 27 is a stacked body of, for example, Ti/Ni/ Au and is formed on the entirety of the main surface 20b. In other words, this diode is a so-called vertical type diode having the pn junction along the thickness direction thereof.

Since the diode has the vertical structure, a large planar area of the cathode electrode 27 can be ensured. Therefore, the electric field applied to the cathode electrode 27 can be dispersed, and thus, the breakdown voltage performance of the diode can be improved. Also, when the planar area of the cathode electrode 27 is large, the resistance of the diode against external noise can be improved.

In the semiconductor device of the first embodiment, since the HEMT element having the undoped GaN layer as the channel layer 12 is stacked on the semiconductor substrate 20 of the diode made of Si, both the HEMT element and the pn junction diode can be incorporated in the semiconductor chip 30.

Next, other structural characteristics of the anode electrode 26 will be described.

In the insulating layer 18 formed on the main surface 10a of the compound semiconductor layer 10 shown in FIG. 2, a contact hole (opening) 19 is provided on the source electrode 17. A conductive material such as Al which forms the anode electrode 26 of the diode is also filled in the contact hole 19. More specifically, the $p^+$ region 23 which is the anode region of the diode is electrically connected to the source electrode 17 of the transistor via the conductive material constituting the anode electrode 26.

When the semiconductor chip 30 is used as the switching element 3 of the power conversion device 100 shown in FIG. 1, the transistor 1 and the diode 2 are connected in parallel to each other. In the first embodiment, the source electrode 17 of the transistor and the anode electrode 26 of the diode provided in the semiconductor chip 30 are electrically connected to each other in the semiconductor chip 30.

Also, in FIG. 2, above the main surface 10a of the compound semiconductor layer 10, the anode electrode 26 extends from the source electrode 17 side to a part between the gate electrode 16 and the drain electrode 15 along the main surface 10a. Specifically, the anode electrode 26 extends on the insulating layer 18 which covers the drain electrode 15 and the gate electrode 16.

When the anode electrode 26 is disposed in this manner, it can also function as a field plate. Therefore, the electric field applied between the gate and drain of the transistor can be reduced. Accordingly, the breakdown voltage performance of the transistor can be improved.

Embodiment of Semiconductor Device

Figure 3:
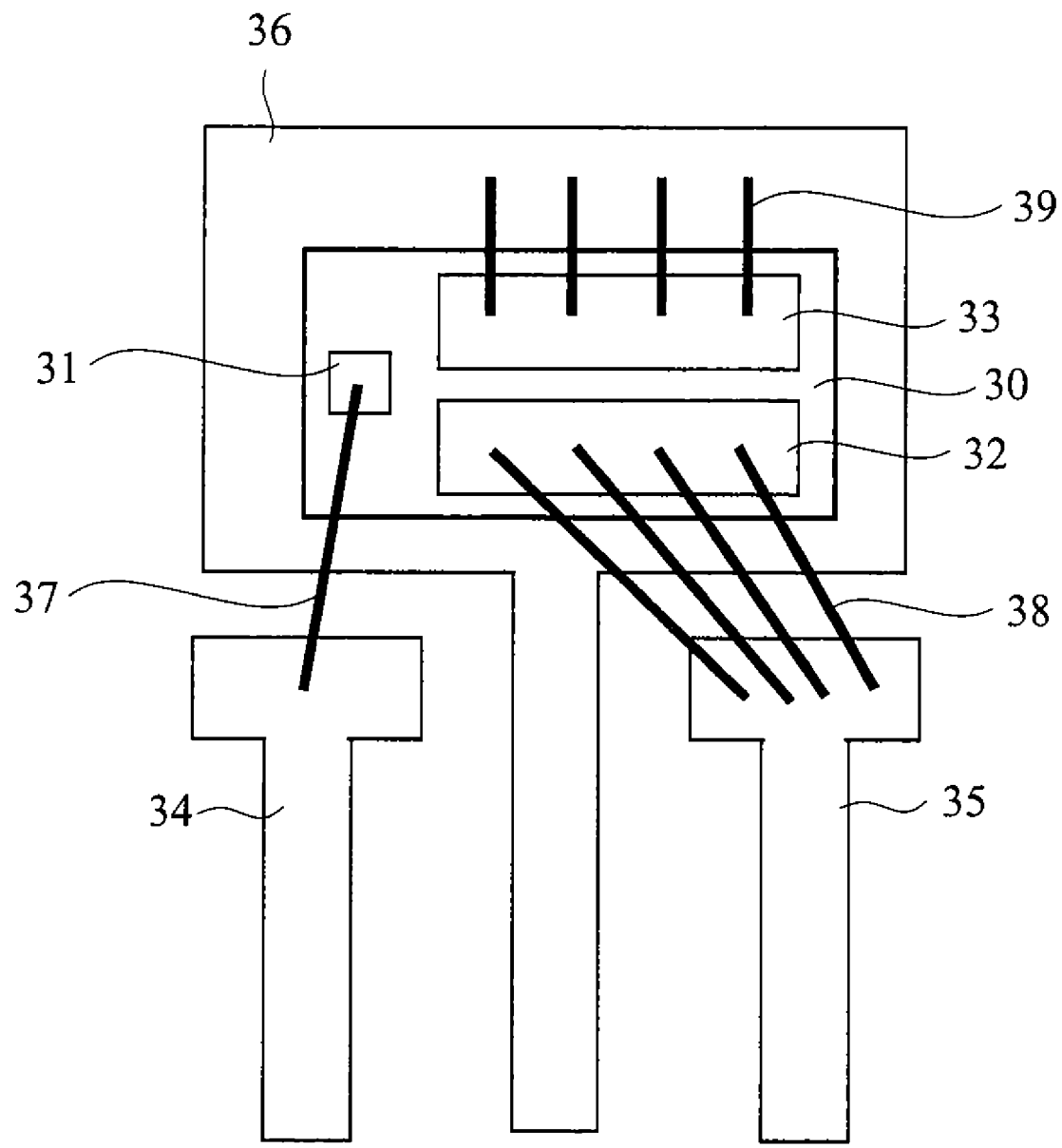
FIG. 3 is a plan view showing a package structure example of the semiconductor device of FIG. 1.

Next, a structure example of a semiconductor package in which the semiconductor chip 30 shown in FIG. 2 is mounted as the switching element of the power conversion device will be described with reference to FIG. 3. FIG. 3 is a plan view showing a package structure example of the semiconductor chip 30 of FIG. 1.

In FIG. 3, on the surface of the semiconductor chip 30, the gate pad 31, the source pad 32 and the drain pad 33 are formed. The gate pad 31, the source pad 32 and the drain pad 33 are external connection terminals of the semiconductor chip 30 and are electrically connected to the gate electrode 16, the source electrode 17 and the drain electrode 15 shown in FIG. 2, respectively.

Also, the gate pad 31, the source pad 32 and the drain pad 33 are electrically connected to a gate terminal 34, a source terminal 35 and a drain terminal 36 provided in the package, respectively. As the electrical connection means, for example, they are electrically connected via bonding wires 37, 38 and 39 which are conductive members.

Further, since the anode electrode 26 of the diode described in FIG. 2 is electrically connected to the source electrode 17 in the semiconductor chip 30, an external connection terminal dedicated to the anode electrode 26 is not required to be formed, and the anode electrode 26 is electrically connected to the source terminal 35 via the source pad 32.

Furthermore, since the cathode electrode 27 of the diode described in FIG. 2 is formed on the main surface 20b side of the semiconductor chip 30, it is electrically connected to drain terminal 36 in a state of facing to the mounting surface of the semiconductor chip 30 formed on the drain terminal 36. As the electrical connection means of the cathode electrode 27 and the drain terminal 36, for example, a connecting method using a conductive resin such as Ag (silver) paste can be applied.

As shown in FIG. 3, both the cathode electrode 27 (see FIG. 2) of the diode and the drain electrode 15 (see FIG. 2) of the transistor provided in the semiconductor chip 30 are electrically connected to the drain terminal 36, respectively. Therefore, the cathode electrode 27 (see FIG. 2) and the drain electrode 15 are electrically connected.

Therefore, with the electrical connection structure as described above, the switching element 3 in which the transistor 1 and the diode 2 are connected in parallel as shown in FIG. 1 can be formed.

<Manufacturing Method of Semiconductor Device>

Next, a manufacturing method of the semiconductor device shown in FIG. 2 will be described with reference to FIG. 4 to FIG. 9.

FIG. 4 to FIG. 9 are cross sectional views showing a main part of a substrate in each of the main steps for manufacturing the semiconductor chip 30 shown in FIG. 2.

Figure 4:
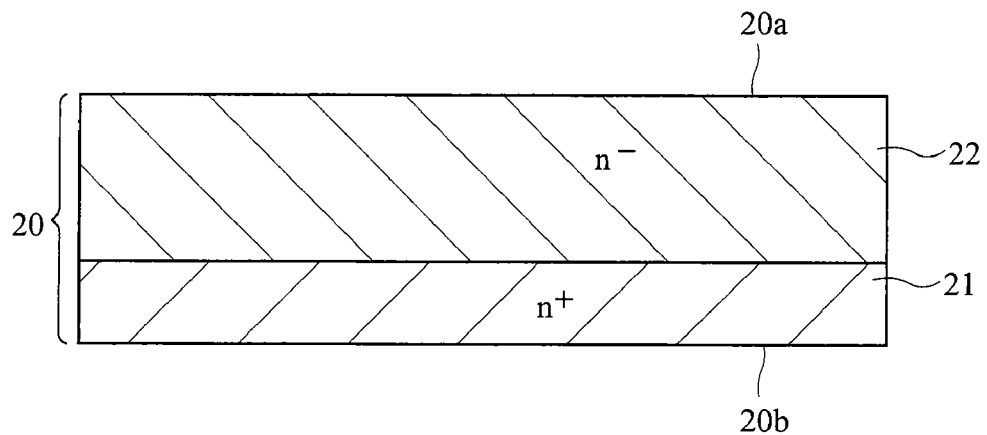
FIG. 4 is a cross sectional view showing a substrate preparation step for manufacturing the semiconductor device of FIG. 2.

(a) First, in a substrate preparation step, the semiconductor substrate 20 (the semiconductor substrate 20 at this stage is a semiconductor thin plate having an approximately circular plane referred to as a wafer) having the $n^+$ layer 21 which is a Si semiconductor layer and the $n^-$ layer 22 formed on the $n^+$ layer 21 shown in FIG. 4 is prepared. The $n^-$ layer 22 can be formed on the $n^+$ layer 21 by, for example, epitaxial growth method.

Figure 5:
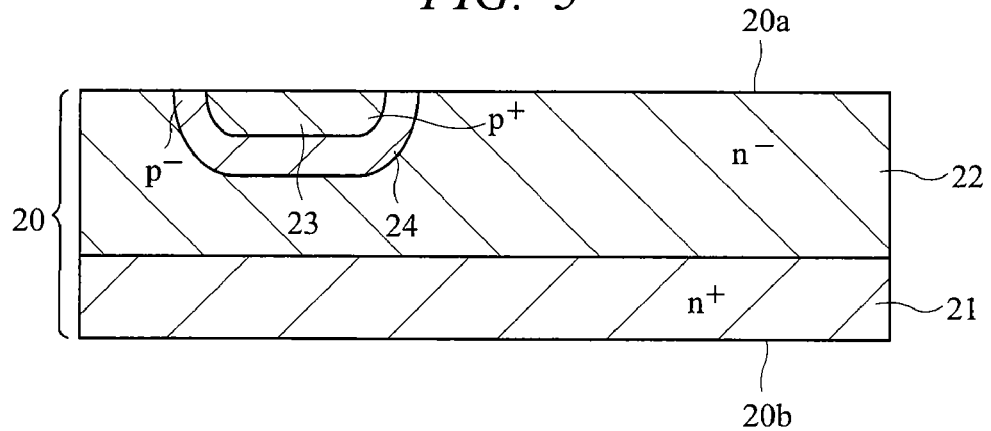
FIG. 5 is a cross sectional view showing a main part of the substrate illustrating an anode region formation step for manufacturing the semiconductor device of FIG. 2.

(b) Next, in an anode region formation step, the $p^-$ region 24 and the $p^+$ region 23 to be the anode region of the diode are sequentially formed in the $n^-$ layer 22 formed on the main surface 20a side of the semiconductor substrate 20 shown in FIG. 5.

The $p^-$ region 24 and the $p^+$ region 23 are not formed in the entire surface of the $n^-$ layer 22, but are selectively formed in a part of the main surface 20a of the $n^-$ layer 22. In this step, the $p^-$ region 24 and the $p^+$ region 23 can be formed by using ion implantation method and thermal diffusion method in combination.

The $p^-$ region 24 and the $p^+$ region 23 can also be formed by using ion implantation method and thermal diffusion method in combination after a step (e) of forming the insulating layer and via hole described later. In this case, however, since this step is performed after various electrodes of the transistor have been formed, the thermal treatment at a high temperature is difficult. Therefore, they are preferably formed at this stage before stacking the transistor.

Figure 6:
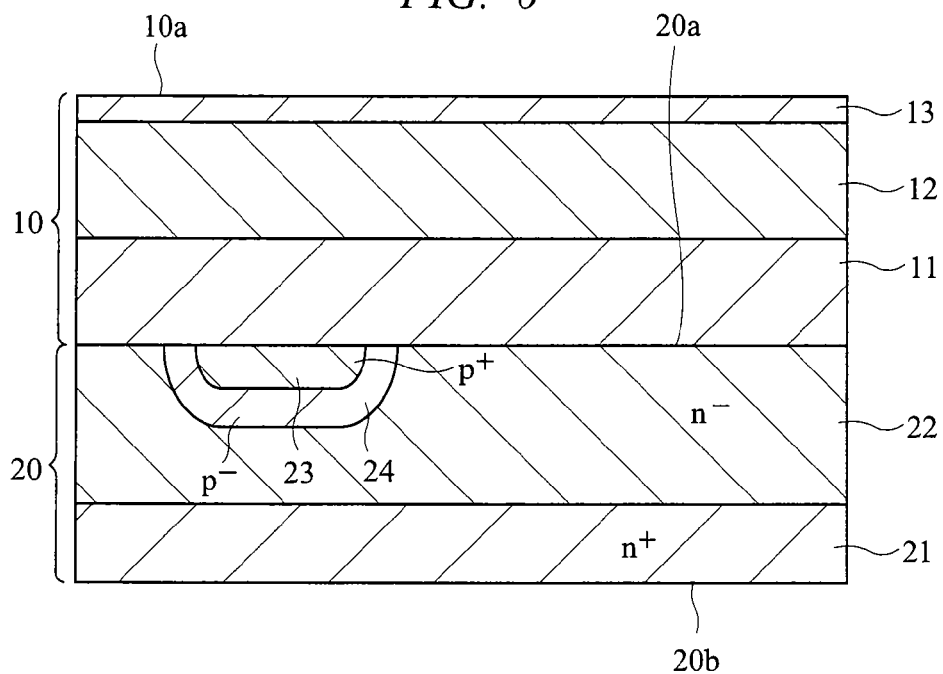
FIG. 6 is a cross sectional view showing a main part of the substrate illustrating a compound semiconductor layer formation step for manufacturing the semiconductor device of FIG. 2.

(c) Next, in a compound semiconductor layer formation step, the buffer layer 11 made of AlN, the channel layer 12 made of undoped GaN and the electron supplying layer 13 made of AlGaN are sequentially formed and stacked on the main surface 20a of the semiconductor substrate 20 shown in FIG. 6.

In this step, the buffer layer 11, the channel layer 12 and the electron supplying layer 13 can be formed by metal organic vapor deposition (MOCVD).

Figure 7:
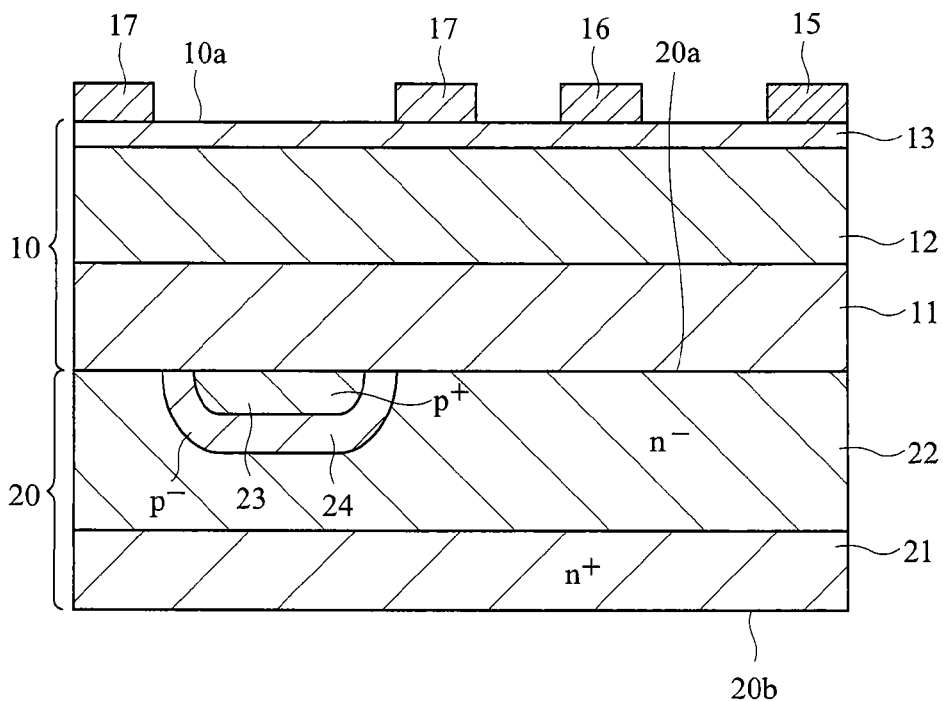
FIG. 7 is a cross sectional view showing a main part of the substrate illustrating a transistor electrode formation step for manufacturing the semiconductor device shown in FIG. 2.

(d) Next, in a transistor electrode formation step, the drain electrode 15, the gate electrode 16 and the source electrode 17 are respectively formed on the main surface 10a of the compound semiconductor layer 10 shown in FIG. 7.

Note that the drain electrode 15 and the source electrode 17 are formed of, for example, a stacked body in which Al is stacked on Ti so that ohmic junction can be established with the electron supplying layer 13. Also, the gate electrode 16 is formed of, for example, a stacked body in which Au is stacked on Ni so that Schottky junction can be established with the electron supplying layer 13.

Figure 8:
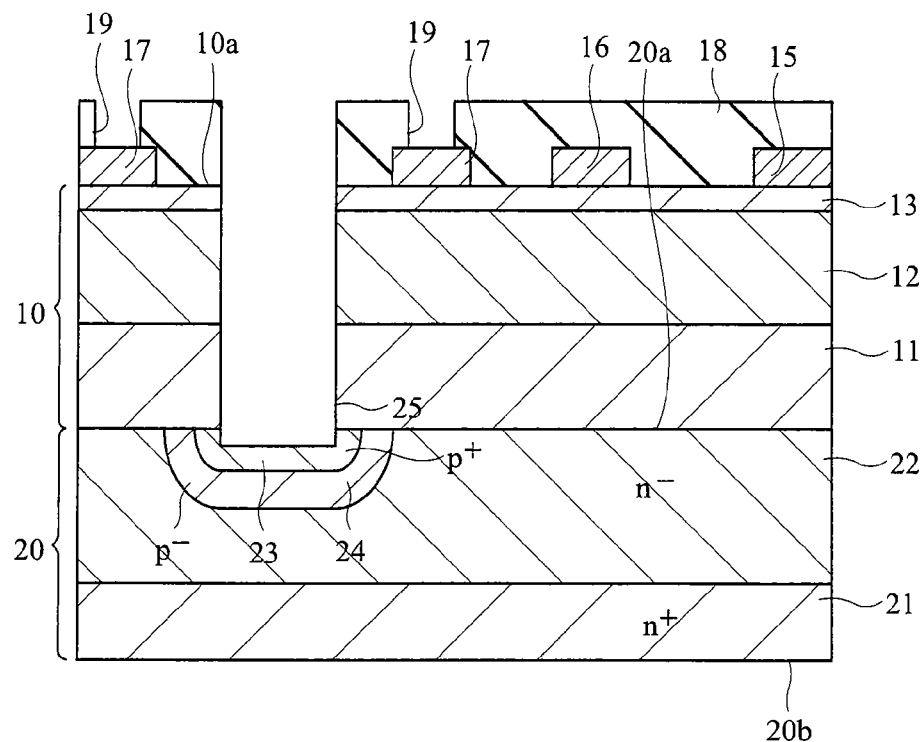
FIG. 8 is a cross sectional view showing a main part of the substrate illustrating a insulating layer and via hole formation step for manufacturing the semiconductor device of FIG. 2.
Figure 9:
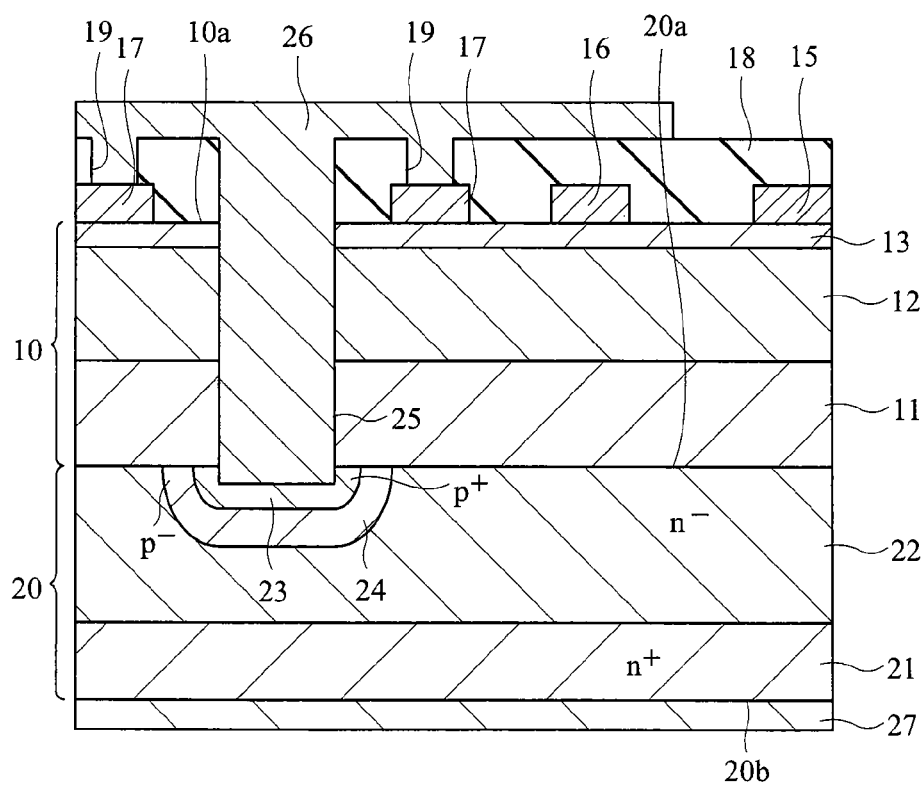
FIG. 9 is a cross sectional view showing a main part of the substrate illustrating a wiring step for manufacturing the semiconductor device of FIG. 2.

(e) Next, in the insulating layer and via hole formation step, after the insulating layer 18 is formed on the main surface 10a of the compound semiconductor layer 10 shown in FIG. 8, the via hole 25 is formed. In this step, first, the insulating layer 18 formed of, for example, $SiN/SiO_2$, is deposited. Next, the via hole 25 is formed by photolithography and dry etching.

Note that, in the main surface 10a of the compound semiconductor layer 10, the via hole 25 is formed by etching from the part above the region where the $p^+$ region 23 to be the anode region of the diode is formed to the depth that reaches the $p^+$ region 23. Therefore, the upper surface (main surface 20a) of the $p^+$ region 23 is exposed on the bottom surface of the via hole 25.

In addition, in this step, the contact hole 19 is formed in a part of the insulating layer 18 deposited above the region where the source electrode 17 is formed. The contact hole 19 is formed so as to be in contact with the source electrode 17. More specifically, a part of the source electrode 17 is exposed by forming the contact hole 19.

(f) Next, in a wiring step, the anode electrode 26 and the cathode electrode 27 of the diode are formed. In this step, the anode electrode 26 is formed by embedding a conductive material such as Al in the via hole 25. At this time, the conductive material constituting the anode electrode 26 is also embedded in the contact hole 19 on the source electrode 17 formed in the step (e), and the source electrode 17 and the anode electrode 26 are electrically connected to each other.

Also, the conductive material constituting the anode electrode 26 is formed so as to extend from the source electrode 17 side to the part between the gate electrode 16 and the drain electrode 15 on the insulating layer 18 in order to cause the anode electrode 26 to function as a field plate.

In addition, on the main surface 20b of the semiconductor substrate 20, the cathode electrode 27 of the diode is formed. The cathode electrode 27 is formed by, for example, sequentially stacking Ti, Ni and Au in this order from below so as to establish ohmic junction with the $n^+$ layer 21.

The semiconductor device shown in FIG. 2 can be manufactured through the steps described above.

Second Embodiment

Figure 10:
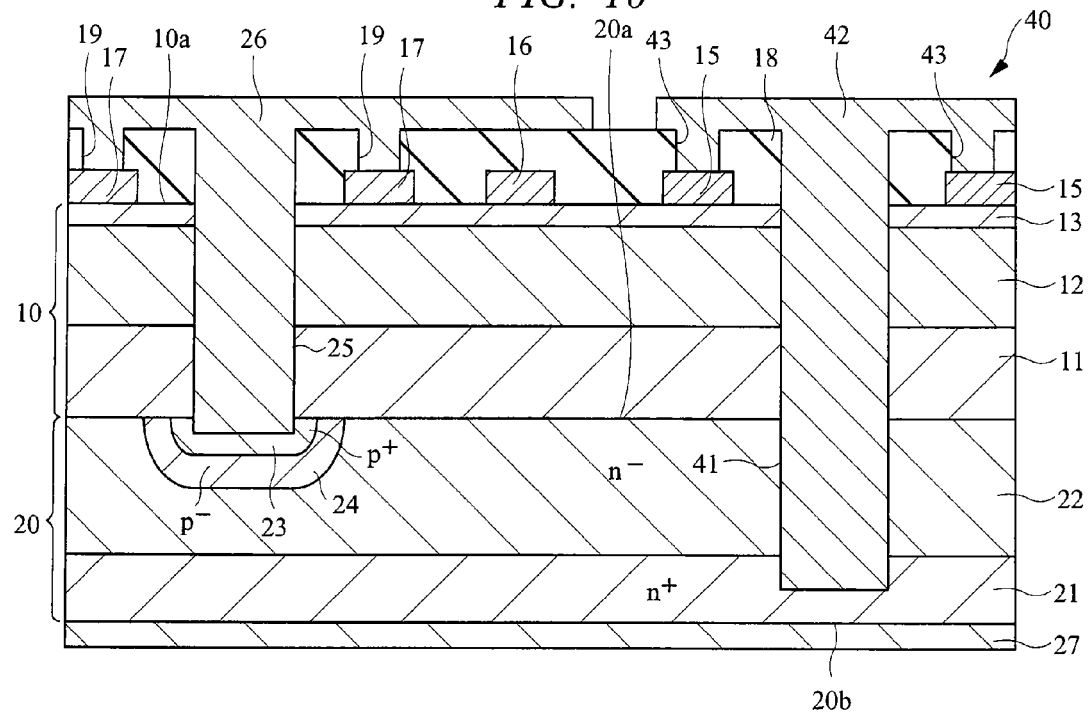
FIG. 10 is a cross sectional view showing a main part of a semiconductor chip constituting a semiconductor device according to a second embodiment of the present invention.

Next, a semiconductor device of a second embodiment will be described with reference to FIG. 10. FIG. 10 is a cross sectional view showing a main part of a semiconductor chip 40 constituting the semiconductor device of the second embodiment.

In FIG. 10, the difference between the semiconductor chip 40 of the second embodiment and the semiconductor chip 30 described in the first embodiment lies in that the cathode electrode 27 of the diode is electrically connected to the drain electrode 15 of the transistor in the semiconductor chip 40.

In the semiconductor chip 40, a via hole (hole) 41 which reaches the n⁺ layer 21 of the semiconductor substrate 20 from the main surface 10a of the compound semiconductor layer 10 is formed. The via hole 41 penetrates also through the insulating layer 18. In other words, at the stage when the via hole 41 is formed, the upper surface of the n⁺ layer 21 is exposed on the bottom surface of the via hole 41.

In addition, a contact hole (opening) 43 is formed in the insulating layer 18 on the drain electrode 15 in the same manner as the contact hole 19 formed on the source electrode 17.

A conductive material 42 such as Al is embedded in the via hole 41 and the contact hole 43. Further, the conductive material 42 is formed also on the insulating layer 18 so as to connect the via hole 41 and the contact hole 43. Therefore, the drain electrode 15 and the n⁺ layer 21 are electrically connected to each other.

In short, the cathode electrode 27 of the diode and the drain electrode 15 of the transistor provided in the semiconductor chip 40 are electrically connected to each other via the conductive material 42 embedded in the via hole.

As described above, in the semiconductor chip 40, the via hole (hole) 41 which reaches the n⁺ layer 21 of the semiconductor substrate 20 from the main surface 10a of the compound semiconductor layer 10 is formed, and the conductive material 42 is embedded therein. In this manner, the cathode electrode 27 and the drain electrode 15 can be electrically connected to each other in the semiconductor chip 40 via the conductive material 42.

In the semiconductor chip 40 of the second embodiment, the cathode electrode 27 and the drain electrode 15 are electrically connected to each other in the semiconductor chip 40. Therefore, when the semiconductor chip 40 is mounted in, for example, a package used in a power conversion device like that shown in FIG. 3, the drain pad 33 and the drain terminal 36 can be electrically connected without using the bonding wires 39.

Therefore, since the region for connecting the bonding wires 39 is not required to be reserved on the drain terminal 36, the planar area of the drain terminal 36 can be reduced. More specifically, the switching element of the power conversion device can be miniaturized.

According to the second embodiment, the switching element of the power conversion device can be further miniaturized than the semiconductor chip 30 described in the first embodiment.

Next, the difference between a manufacturing method of the semiconductor chip 40 of the second embodiment and the manufacturing method of the semiconductor chip 30 described in the first embodiment will be described.

In the manufacturing method of the semiconductor chip 40 of the second embodiment, in the step (e) described in the first embodiment, after the via hole 25 is formed by photolithography and dry etching, a photolithography step and a dry etching step are further added.

In the added photolithography step and the dry etching step, the via hole 41 shown in FIG. 10 is formed. Also, the contact hole 43 can be formed together when forming the contact hole 19 in the insulating layer 18 in the step (e).

Next, the conductive material 42 is formed together when forming the anode electrode 26 in the wiring step (f).

Third Embodiment

Figure 11:
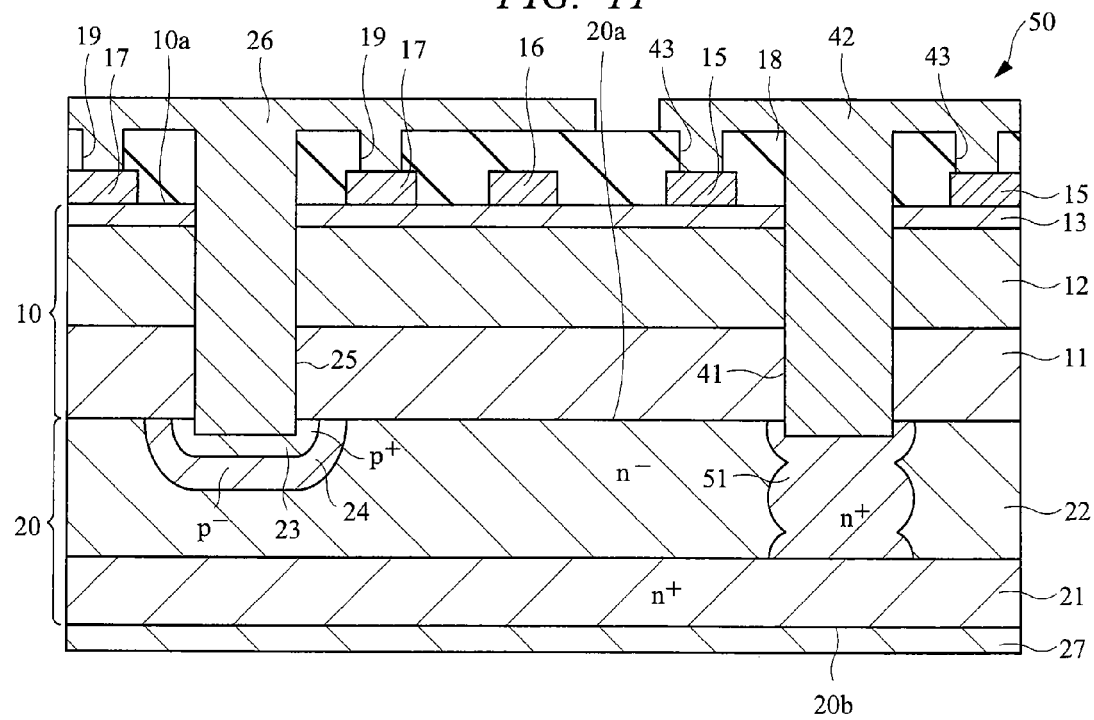
FIG. 11 is a cross sectional view showing a main part of a semiconductor chip constituting a semiconductor device according to a third embodiment of the present invention.

Next, a semiconductor device of a third embodiment will be described with reference to FIG. 11. FIG. 11 is a cross sectional view showing a main part of a semiconductor chip 50 constituting the semiconductor device of the third embodiment.

In FIG. 11, the difference between the semiconductor chip 50 of the third embodiment and the semiconductor chip 40 of the second embodiment lies in the electrical connection structure between the cathode electrode 27 and the drain electrode 15.

More specifically, in the semiconductor chip 50 of the third embodiment, first, an n⁺ region (third semiconductor region) 51 which extends from the main surface 20a of the semiconductor substrate 20 to the contact surface between the n⁻ layer 22 and the n⁺ layer 21 is formed in a part of the n⁻ layer 22. Moreover, secondly, the via hole 41 is not formed to the depth where it reaches the n⁺ layer 21, but is formed to the depth where it reaches the n⁺ region (third semiconductor region) 51 from the main surface 10a of the compound semiconductor layer 10.

The impurity concentration of the n⁺ region 51 is higher than the impurity concentration of the n⁻ layer 22 and is equivalent to the impurity concentration of the n⁺ layer 21. Therefore, in the third embodiment, as shown in FIG. 11, the via hole 41 for electrically connecting the cathode electrode 27 and the drain electrode 15 is not required to have the depth (length in the thickness direction) where it reaches the n⁺ layer 21 having the high impurity concentration, and the via hole 41 may be formed to have the depth where it reaches the n⁺ region 51.

More specifically, the via hole 41 can be shallow compared with the semiconductor chip 40 described in the second embodiment. Therefore, as shown in FIG. 11, the depths of the via hole 41 and the via hole 25 can be set equal to each other.

Since the via hole 41 and the via hole 25 are formed to have the same depth, in the manufacturing step of the semiconductor chip 50, the via hole 41 can be formed at the same time when the via hole 25 is formed by photolithography and dry etching in the step (e) described in the first embodiment. In short, unlike the manufacturing method of the semiconductor chip 40 described in the second embodiment, the photolithography step and the dry etching step are not required to be added, and thus, the manufacturing process can be simplified.

Note that, as long as the via hole 41 and the via hole 25 are in contact with the main surface 20a of the semiconductor substrate 20 and formed in the same manufacturing step, the depths thereof are not required to be completely equal to each other. In other words, the case where the depth of one of the via holes is slightly deeper than the depth of the other via hole due to influence of processing accuracy is not excluded.

In the manufacturing method of the semiconductor chip 50 of the third embodiment, the n⁺ region 51 is preferably formed in the step (b) described in the first embodiment.

More specifically, before or after the step of sequentially forming the p⁻ region 24 and the p⁺ region 23 to be the anode region of the diode in the n⁻ layer 22 formed on the main surface 20a side of the semiconductor substrate 20 shown in FIG. 5, the n⁺ region 51 can be formed in a part of the n⁻ layer 22.

In the case where the n⁻ layer 22 is thick, when the n⁺ region 51 is formed by one ion implantation, the n⁺ region 51 sometimes does not reach the n⁺ layer 21 from the main surface 20a. In this case, the n⁺ layer 51 can be brought into contact with the n⁺ layer 21 by using high energy ion implantation of plural levels. In FIG. 11, as an example using the high energy ion implantation of plural levels, the state of the n⁺ region 51 formed by using the high energy ion implantation of three levels is shown.

In the manufacturing method of the third embodiment, compared with the manufacturing method described in the second embodiment, an ion implantation step for forming the n+ region 51 is added. However, since the ion implantation step can be readily controlled compared with the photolithography step or dry etching step therefore, the manufacturing efficiency as the whole manufacturing steps can be improved.

In addition, also in the semiconductor chip 50 shown in FIG. 11, since the cathode electrode 27 and the drain electrode 15 are electrically connected to each other in the semiconductor chip 50, it goes without saying that similar effects as the semiconductor chip 40 described in the second embodiment can be obtained.

Fourth Embodiment

Figure 12:
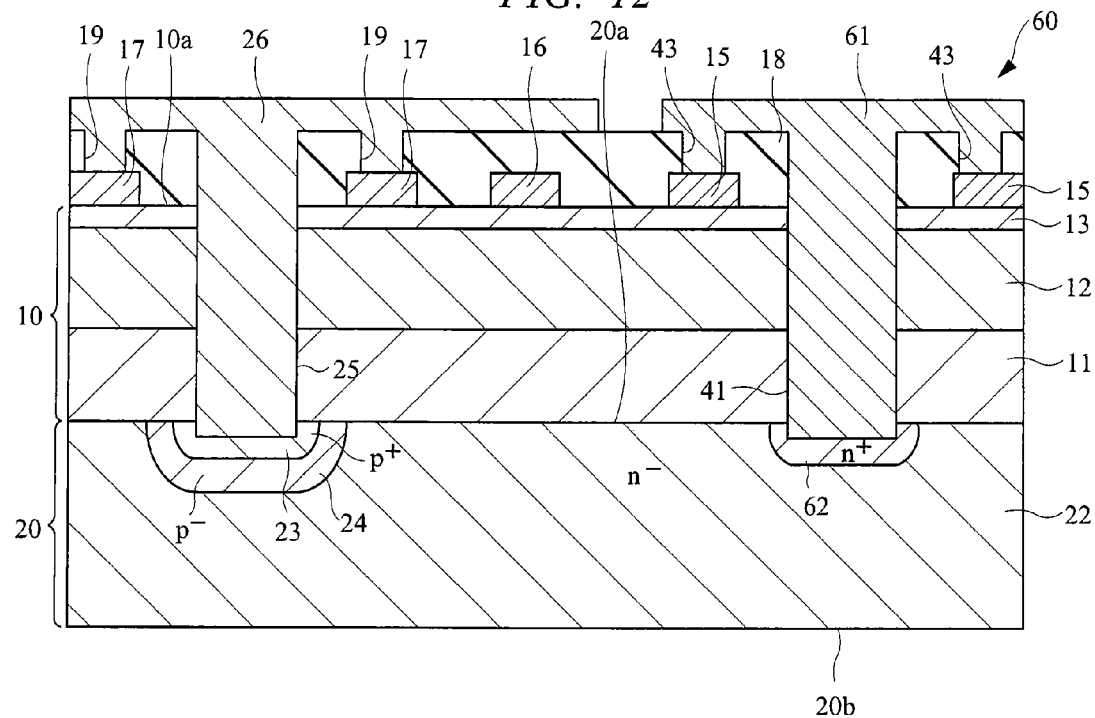
FIG. 12 is a cross sectional view showing a main part of a semiconductor chip constituting a semiconductor device according to a fourth embodiment of the present invention.

Next, a semiconductor device of a fourth embodiment will be described with reference to FIG. 12. FIG. 12 is a cross sectional view showing a main part of a semiconductor chip 60 constituting the semiconductor device of the fourth embodiment.

The difference between the semiconductor chip 60 of the fourth embodiment and the semiconductor chip 50 of the third embodiment lie in the position of the cathode electrode of the diode.

More specifically, the cathode electrode 27 of the diode of the semiconductor chip 50 shown in FIG. 11 described in the third embodiment is formed on the main surface 20b side of the semiconductor substrate 20. Such a structure of the diode is called a vertical structure, in which carriers move along the thickness direction of the semiconductor substrate 20.

On the other hand, in the semiconductor chip 60 of the fourth embodiment, a cathode electrode 61 is formed on the main surface 20a side of the semiconductor substrate 20. Such a structure of the diode in which the anode electrode 26 and the cathode electrode 61 are formed on the same main surface 20a side in this manner is called a horizontal structure, in which carriers move along the main surface 20a of the semiconductor substrate 20.

When the diode is formed to have the horizontal structure like the semiconductor chip 60 shown in FIG. 12, the breakdown voltage has to be retained in the direction along the main surface 20a of the semiconductor substrate 20. Therefore, compared with the semiconductor chips 30, 40 and 50 described in the first to third embodiments, the increase in the breakdown voltage of the diode is difficult.

However, when the diode has the horizontal structure, since the n+ region 62 which is a contact layer in the cathode region is formed on the main surface 20a side, the semiconductor substrate 20 can be formed to have a single-layer structure of the n− layer 22. When the semiconductor substrate 20 has the single-layer structure, since an epitaxial growth step is not required to be performed when the semiconductor substrate 20 is manufactured, the manufacturing process can be simplified.

Moreover, when the diode has the horizontal structure, since the electrode is not required to be formed on the main surface 20b side, the manufacturing process can be simplified. Furthermore, different from the n+ region 51 provided in the semiconductor chip 50 shown in FIG. 11 described in the third embodiment, the n+ region 62 which is the contact layer in the cathode region is not required to be formed to extend from the main surface 20a to the lower surface of the n− layer 22. Therefore, the load due to the increase in the number of steps caused by the addition of the n+ region 62 can be reduced.

In the manufacturing method of the semiconductor chip 60, the n+ region 62 is preferably formed in the step (b) described in the first embodiment.

More specifically, after the step of sequentially forming the p− region 24 and the p+ region 23 to be the anode region of the diode in the n− layer 22 formed on the main surface 20a side of the semiconductor substrate 20 shown in FIG. 5, the n+ region 62 can be formed in a part of the n− layer 22 by ion implantation.

Also, the cathode electrode 61 can be formed by the manufacturing method similar to that of the conductive material 42 shown in FIG. 11 described in the third embodiment.

Fifth Embodiment

Figure 13:
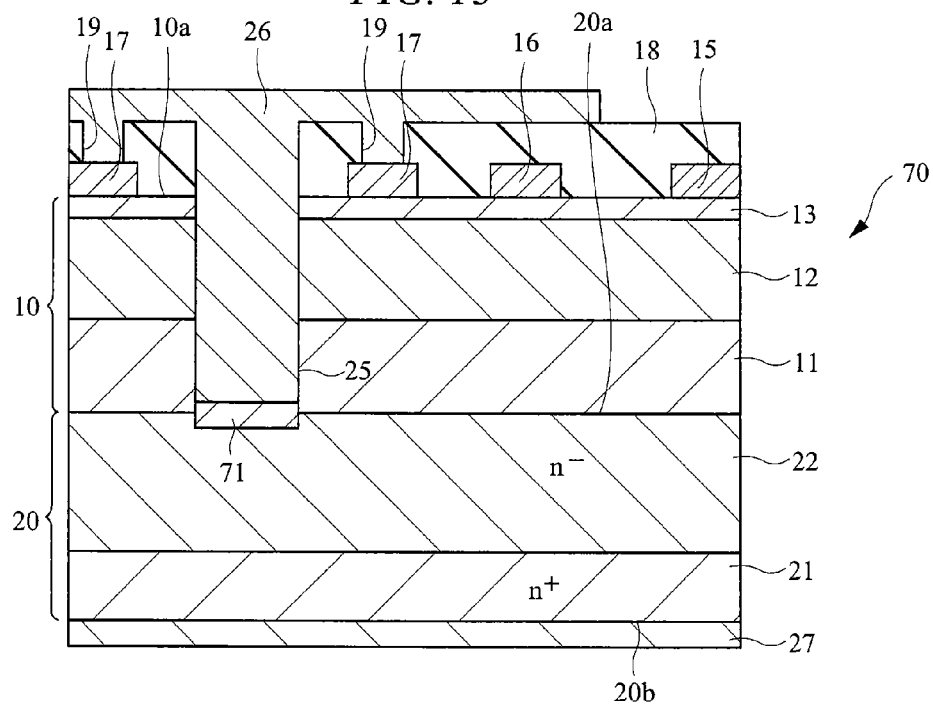
FIG. 13 is a cross sectional view showing a main part of a semiconductor chip constituting a semiconductor device according to a fifth embodiment of the present invention.

Next, a semiconductor device of a fifth embodiment will be described with reference to FIG. 13. FIG. 13 is a cross sectional view showing the structure of a semiconductor chip 70 of the fifth embodiment.

The difference between the semiconductor chip 70 of the fifth embodiment and the semiconductor chip 30 of the first embodiment lies in that the diode is a Schottky barrier diode.

More specifically, the anode region provided in the diode of the semiconductor chip 70 is made of a Schottky barrier metal 71 formed of, for example, TiW (titanium tungsten).

Herein, each of the n+ layer 21 and the n− layer 22 is a semiconductor layer obtained by adding a predetermined amount of an impurity (for example, phosphorus) to Si which is a semiconductor. The Schottky diode formed on the substrate of Si in this manner is difficult to have a high breakdown voltage (for example, a breakdown voltage of 100 V or more).

However, since the semiconductor chip 70 uses the Schottky barrier diode as the diode, different from the pn junction diode of the semiconductor chip 30 shown in FIG. 2 described in the first embodiment, the p− region 24 and the p+ region 23 are not required to be formed as the anode region. Therefore, the manufacturing process can be simplified.

Moreover, compared with the pn junction diode, the Schottky diode can suppress the Vf (forward Voltage) and recovery current. Therefore, when used for a low breakdown voltage such as a DC-DC converter for power source, for example, the power loss at the power conversion can be reduced.

In the manufacturing method of the semiconductor chip 70 of the fifth embodiment, the step (b) described in the first embodiment can be omitted.

Also, in the step (e), the via hole 25 is formed from the insulating layer 18, which is formed on the main surface 10a of the compound semiconductor layer 10 shown in FIG. 8, to have a depth reaching the main surface 20a of the semiconductor substrate 20. Then, on the bottom of the via hole 25, that is, the region in contact with the n− layer 22, for example, TiW is deposited, thereby forming the Schottky barrier metal 71.

Sixth Embodiment

Figure 14:
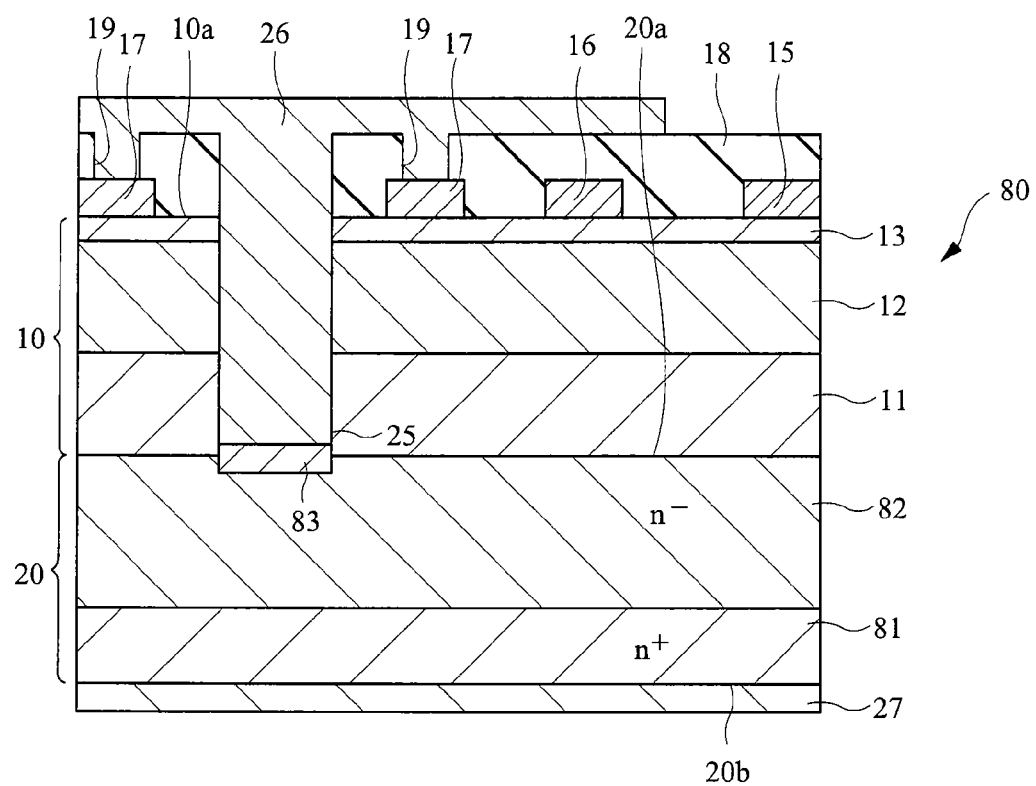
FIG. 14 is a cross sectional view showing a main part of a semiconductor chip constituting a semiconductor device according to a sixth embodiment of the present invention.

Next, a semiconductor device of a sixth embodiment will be described with reference to FIG. 14. FIG. 14 is a cross sectional view showing a main part of a semiconductor chip 80 constituting the semiconductor device of the sixth embodiment.

The difference between the semiconductor chip 80 of the sixth embodiment and the semiconductor chip 70 of the fifth embodiment lies in that the semiconductor substrate 20 having the diode is made of SiC (silicon carbide).

More specifically, each of an n+ layer 81 and an n− layer 82 provided in the diode of the semiconductor chip 80 is a semiconductor layer obtained by adding a predetermined amount of an impurity to SiC which is a semiconductor. Also, for example, Mo (molybdenum) can be used for Schottky barrier metal 83 provided in the diode of the semiconductor chip 80.

As described above, the Schottky diode formed on the Si substrate is difficult to have a high breakdown voltage (for example, a breakdown voltage of 100 V or more). However, When the Schottky barrier diode is formed in the semiconductor substrate 20 made of SiC like the semiconductor chip 80 of the sixth embodiment, the breakdown voltage can be increased to, for example, 600 V or more.

According to the sixth embodiment, since the semiconductor substrate 20 is made of SiC, compared with the semiconductor chip 70 described in the fifth embodiment, the breakdown voltage of the diode incorporated in the semiconductor chip 80 can be increased though cost is increased.

In the foregoing, the invention made by the inventor of the present invention has been concretely described based on the embodiments. However, it is needless to say that the present invention is not limited to the foregoing embodiments and various modifications and alterations can be made within the scope of the present invention.

For example, the semiconductor chip 80 shown in FIG. 14 may have the structure in which the cathode electrode 27 and the drain electrode 15 are electrically connected to each other via the conductive material 42 in the semiconductor chip 80 like that shown in FIG. 10 or FIG. 11.

In this case, when the semiconductor chip 80 is to be mounted in a package of a power conversion device as shown in FIG. 3, the region for connecting the bonding wires 39 is not required to be reserved on the drain terminal 36. Therefore, it goes without saying that the planar area of the drain terminal 36 can be reduced.

The present invention can be applied to a semiconductor device, in particular, to a semiconductor device used in a power conversion device.

What is claimed is:

1. A semiconductor device comprising:

a high electron mobility transistor and a diode in a same semiconductor chip, wherein the semiconductor chip has a semiconductor substrate having a first main surface and a second main surface positioned on mutually opposite sides in a thickness direction and a compound semiconductor layer formed on the semiconductor substrate, wherein the high electron mobility transistor has the compound semiconductor layer, a drain electrode, a gate electrode and a source electrode formed on a main surface of the compound semiconductor layer, wherein the diode has a cathode region formed in the semiconductor substrate, an anode region formed on the first main surface side of the semiconductor substrate so as to be in contact with the cathode region and an anode electrode formed on the main surface of the compound semiconductor layer, wherein the anode electrode is electrically connected to the anode region via a conductive material embedded in a hole which reaches the anode region of the first main surface of the semiconductor substrate from the main surface of the compound semiconductor layer, wherein the source electrode of the high electron mobility transistor and the anode region of the diode are electrically connected to each other, wherein a cathode electrode of the diode is electrically connected to the drain electrode of the high electron mobility transistor in the semiconductor chip, wherein the semiconductor substrate has a first semiconductor layer and a second semiconductor layer of a first conductivity type sequentially stacked from the second main surface, wherein the first semiconductor layer has a first impurity concentration, wherein the second semiconductor layer has a second impurity concentration lower than the first impurity concentration, and wherein the cathode electrode of the diode is electrically connected to the drain electrode via the conductive material embedded in a hole which reaches the first semiconductor layer of the semiconductor substrate from the main surface of the compound semiconductor layer.

2. The semiconductor device according to claim 1, wherein the source electrode of the high electron mobility transistor and the anode region of the diode are connected to each other by the conductive material constituting the anode electrode.

3. The semiconductor device according to claim 2, wherein the drain electrode, the gate electrode and the source electrode are sequentially disposed on the main surface of the compound semiconductor layer at predetermined intervals, and above the main surface of the compound semiconductor layer, the anode electrode is disposed so as to extend along the main surface of the compound semiconductor layer from the source electrode side to a part between the gate electrode and the drain electrode.

4. A semiconductor device comprising:

a high electron mobility transistor and a diode in a same semiconductor chip, wherein the semiconductor chip has a semiconductor substrate having a first main surface and a second main surface positioned on mutually opposite sides in a thickness direction and a compound semiconductor layer formed on the semiconductor substrate, wherein the high electron mobility transistor has the compound semiconductor layer, a drain electrode, a gate electrode and a source electrode formed on a main surface of the compound semiconductor layer, wherein the diode has a cathode region formed in the semiconductor substrate, an anode region formed on the first main surface side of the semiconductor substrate so as to be in contact with the cathode region and an anode electrode formed on the main surface of the compound semiconductor layer, wherein the anode electrode is electrically connected to the anode region via a conductive material embedded in a hole which reaches the anode region of the first main surface of the semiconductor substrate from the main surface of the compound semiconductor layer, wherein the source electrode of the high electron mobility transistor and the anode region of the diode are electrically connected to each other, wherein a cathode electrode of the diode is electrically connected to the drain electrode of the high electron mobility transistor in the semiconductor chip, wherein the semiconductor substrate has a first semiconductor layer and a second semiconductor layer of a first conductivity type sequentially stacked from the second main surface, wherein the first semiconductor layer has a first impurity concentration, wherein the second semiconductor layer has a second impurity concentration lower than the first impurity concentration, wherein the second semiconductor layer has a third semiconductor region which extends from the first main surface to reach a contact surface with the first semiconductor layer, and wherein the cathode electrode of the diode is electrically connected to the drain electrode via the conductive material embedded in a hole which reaches the third semiconductor region of the semiconductor substrate from the main surface of the compound semiconductor layer.

5. The semiconductor device according to claim 1,
wherein a semiconductor material constituting the semiconductor substrate is silicon.

6. The semiconductor device according to claim 1,
wherein the anode region of the diode is a semiconductor region having a conductivity type opposite to the first conductivity type.

7. The semiconductor device according to claim 1,
wherein the semiconductor substrate has a first semiconductor layer and a second semiconductor layer of a first conductivity type sequentially stacked from the second main surface,
wherein the first semiconductor layer has a first impurity concentration,
wherein the second semiconductor layer has a second impurity concentration lower than the first impurity concentration, and
wherein the anode region of the diode is a Schottky barrier metal.

8. The semiconductor device according to claim 7,
wherein a semiconductor material constituting the semiconductor substrate is silicon carbide.

9. A power conversion device comprising:
a semiconductor device as a switching element,
wherein the semiconductor device includes a high electron mobility transistor and a diode in a same semiconductor chip,
wherein the semiconductor chip has a semiconductor substrate having a first main surface and a second main surface positioned on mutually opposite sides in a thickness direction and a compound semiconductor layer formed on the semiconductor substrate,
wherein the high electron mobility transistor has the compound semiconductor layer, a drain electrode, a gate electrode and a source electrode formed on a main surface of the compound semiconductor layer,
wherein the diode has a cathode region formed in the semiconductor substrate, an anode region formed on the first main surface side of the semiconductor substrate so as to be in contact with the cathode region and an anode electrode formed on the main surface of the compound semiconductor layer,
wherein the anode electrode is electrically connected to the anode region via a conductive material embedded in a hole which reaches the anode region of the first main surface of the semiconductor substrate from the main surface of the compound semiconductor layer,
wherein the semiconductor substrate has a first semiconductor layer and a second semiconductor layer of a first conductivity type sequentially stacked from the second main surface,
wherein the first semiconductor layer has a first impurity concentration,
wherein the second semiconductor layer has a second impurity concentration lower than the first impurity concentration, and wherein the cathode electrode of the diode is electrically connected to the drain electrode via the conductive material embedded in a hole which reaches the first semiconductor layer of the semiconductor substrate from the main surface of the compound semiconductor layer.

10. The semiconductor device according to claim 4,
wherein the source electrode of the high electron mobility transistor and the anode region of the diode are connected to each other by the conductive material constituting the anode electrode.

11. The semiconductor device according to claim 4,
wherein the drain electrode, the gate electrode and the source electrode are sequentially disposed on the main surface of the compound semiconductor layer at predetermined intervals, and
above the main surface of the compound semiconductor layer, the anode electrode is disposed so as to extend along the main surface of the compound semiconductor layer from the source electrode side to a part between the gate electrode and the drain electrode.

12. The semiconductor device according to claim 4,
wherein a semiconductor material constituting the semiconductor substrate is silicon.

13. The semiconductor device according to claim 4,
wherein the anode region of the diode is a semiconductor region having a conductivity type opposite to the first conductivity type.

14. The semiconductor device according to claim 4,
wherein the semiconductor substrate has a first semiconductor layer and a second semiconductor layer of a first conductivity type sequentially stacked from the second main surface,
wherein the first semiconductor layer has a first impurity concentration,
wherein the second semiconductor layer has a second impurity concentration lower than the first impurity concentration, and
wherein the anode region of the diode is a Schottky barrier metal.

15. The semiconductor device according to claim 14,
wherein a semiconductor material constituting the semiconductor substrate is silicon carbide.

16. A power conversion device comprising:
a semiconductor device as a switching element,
wherein the semiconductor device includes a high electron mobility transistor and a diode in a same semiconductor chip,
wherein the semiconductor chip has a semiconductor substrate having a first main surface and a second main surface positioned on mutually opposite sides in a thickness direction and a compound semiconductor layer formed on the semiconductor substrate,
wherein the high electron mobility transistor has the compound semiconductor layer, a drain electrode, a gate electrode and a source electrode formed on a main surface of the compound semiconductor layer,
wherein the diode has a cathode region formed in the semiconductor substrate, an anode region formed on the first main surface side of the semiconductor substrate so as to be in contact with the cathode region and an anode electrode formed on the main surface of the compound semiconductor layer, wherein the anode electrode is electrically connected to the anode region via a conductive material embedded in a hole which reaches the anode region of the first main surface of the semiconductor substrate from the main surface of the compound semiconductor layer, wherein the semiconductor substrate has a first semiconductor layer and a second semiconductor layer of a first conductivity type sequentially stacked from the second main surface, wherein the first semiconductor layer has a first impurity concentration, wherein the second semiconductor layer has a second impurity concentration lower than the first impurity concentration, wherein the second semiconductor layer has a third semiconductor region which extends from the first main surface to reach a contact surface with the first semiconductor layer, and wherein the cathode electrode of the diode is electrically connected to the drain electrode via the conductive material embedded in a hole which reaches the third semiconductor region of the semiconductor substrate from the main surface of the compound semiconductor layer.

* * * * *